(12) United States Patent
Whitman et al.

(10) Patent No.: US 7,101,771 B2
(45) Date of Patent: Sep. 5, 2006

(54) SPIN COATING FOR MAXIMUM FILL CHARACTERISTIC YIELDING A PLANARIZED THIN FILM SURFACE

(75) Inventors: John Whitman, Boise, ID (US); John Davlin, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/996,423

(22) Filed: Nov. 28, 2001

(65) Prior Publication Data

US 2002/0034884 A1    Mar. 21, 2002

Related U.S. Application Data

(62) Division of application No. 09/542,783, filed on Apr. 4, 2000.

(51) Int. Cl.
H01L 21/31 (2006.01)

(52) U.S. Cl. .................. 438/424; 438/437; 438/763; 438/778; 438/782

(58) Field of Classification Search ............... 438/424, 438/437, 763–778, 782, FOR. 132, FOR. 133
See application file for complete search history.

(56) References Cited

U.S. PATENT DOCUMENTS

| | | | |
|---|---|---|---|
| 4,518,678 A | 5/1985 | Allen | |
| 5,238,878 A | 8/1993 | Shinohara | |
| 5,405,813 A * | 4/1995 | Rodrigues | 438/782 |
| 5,663,090 A | 9/1997 | Dennison et al. | |
| 5,677,001 A | 10/1997 | Wang et al. | |
| 5,818,111 A | 10/1998 | Jeng et al. | |
| 5,821,621 A | 10/1998 | Jeng | |
| 5,824,603 A | 10/1998 | Cho | |
| 5,855,962 A | 1/1999 | Cote et al. | |
| 5,900,290 A | 5/1999 | Yang et al. | |
| 5,923,074 A | 7/1999 | Jeng | |
| 5,937,323 A | 8/1999 | Orczyk et al. | |
| 5,972,803 A | 10/1999 | Shu et al. | |
| 5,980,657 A | 11/1999 | Farrar et al. | |
| 5,994,231 A | 11/1999 | Sonego et al. | |
| 6,046,083 A | 4/2000 | Lin et al. | |
| 6,117,486 A | 9/2000 | Yoshihara | |
| 6,146,968 A | 11/2000 | Lu et al. | |
| 6,228,711 B1 | 5/2001 | Hsieh | |
| 6,235,605 B1 | 5/2001 | Ping | |
| 6,251,487 B1 | 6/2001 | Yonaha | |
| 6,268,246 B1 | 7/2001 | Ukita et al. | |
| 6,278,153 B1 | 8/2001 | Kikuchi et al. | |
| 6,303,430 B1 | 10/2001 | Jenq | |
| 6,326,282 B1 | 12/2001 | Park et al. | |
| 6,358,793 B1 | 3/2002 | Yates et al. | |
| 6,417,066 B1 | 7/2002 | Lou | |
| 6,461,932 B1 | 10/2002 | Wang | |

OTHER PUBLICATIONS

Raymond Serway, Physics, 1983, Saunders College Publishing, pp. 26-32.*
Wolf et al., Silicon Processing for the VLSI Era, vol. 1, Process Technology, pp. 429-434.

* cited by examiner

Primary Examiner—George Fourson
Assistant Examiner—Thanh V. Pham
(74) Attorney, Agent, or Firm—TraskBritt (57) ABSTRACT

A method for spinning a material onto a semiconductor device structure so as to substantially fill recesses formed in a surface of the semiconductor device structure and to impart the material with a substantially planar surface and semiconductor device structures formed thereby. The thickness of the material covering the surface is less than the depth of the recesses. The surface may remain substantially uncovered by the material.

22 Claims, 5 Drawing Sheets

SPIN COATING FOR MAXIMUM FILL CHARACTERISTIC YIELDING A PLANARIZED THIN FILM SURFACE

CROSS-REFERENCE TO RELATED APPLICATION

This application is a divisional of application Ser. No. 09/542,783, filed Apr. 4, 2000, pending.

BACKGROUND OF THE INVENTION

1. Field of the Invention

The present invention relates to methods for filling containers, trenches, or other recesses of semiconductor device structures during fabrication thereof. Particularly, the present invention relates to the use of spin coating techniques to fill containers, trenches, and other recesses of semiconductor device structures. As a specific example, the present invention relates to a method for masking hemispherical grain (HSG) silicon-lined containers of a stacked capacitor structure to facilitate removal of HSG silicon from the surface of a semiconductor device structure including the stacked capacitor structure.

2. Background of Related Art

Conventionally, spin-on processes have been used to apply substantially planar layers of material to the surfaces of semiconductor device structures being fabricated upon a wafer of semiconductor material (e.g., a silicon, gallium arsenide, or indium phosphide wafer) or other semiconductor substrate (e.g., a silicon on insulator (SOI), silicon on glass (SOG), silicon on ceramic (SOC), silicon on sapphire (SOS), or other similar substrate). Consequently, while the portions of a spun-on layer of material over substantially horizontal structures may be substantially planar, the layer of material may not substantially fill or conform to the numerous, minute recesses formed in the semiconductor device structure.

Figure 1:
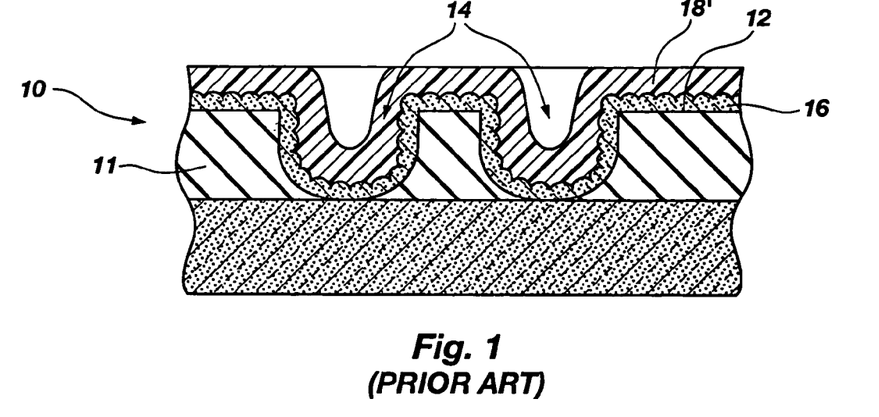
FIG. 1 (Prior Art) is a cross-sectional representation of a stacked capacitor structure with a surface and containers lined with conductively doped hemispherical grain polysilicon and including a conventionally spun-on layer of mask material thereover.

For example, when it is desirable to mask a container, trench, or other recess of a semiconductor device structure without masking the surface of the semiconductor device structure to which the container, trench, or other recess opens, a mask material is typically applied to the surface of the semiconductor device structure, such as by use of known spin-on processes. As an example, FIG. 1 illustrates the fabrication of a stacked capacitor structure 10 with conductively doped HSG silicon 16-lined containers 14. As it is necessary to remove HSG silicon 16 from a surface 12 of an electrical insulator layer 11 (e.g., borophosphosilicate glass (BPSG), phosphosilicate glass (PSG), or borosilicate glass (BSG)) of stacked capacitor structure 10 to prevent electrical shorting between adjacent containers 14, mask material 18' is introduced into containers 14 to facilitate removal of HSG silicon 16 from surface 12.

While conventional spin-on processes will force some of the mask material into containers 14, trenches, or other recesses, these processes typically result in the formation of a relatively thick, but not necessarily planar layer of mask material 18' over surface 12. Due to various factors, including the surface tension of mask material 18' and the centrifugal forces applied to mask material 18' during the spin-on process, mask material 18' tends to migrate out of the small recesses (e.g., containers 14) formed in surface 12. Thus, the thickness of mask material 18' within a container 14, trench, or other recess may not be significantly greater than the thickness of mask material 18' covering surface 12, leaving containers 14 partially unfilled. Once the layer of material has been dispensed onto the semiconductor device structure, it is solidified or cured, such as by known photographic or soft bake processes.

In order to reduce the thickness of the layer of mask material covering the surface of the semiconductor device structure without substantially decreasing the thickness of the layer of mask material within the recesses, chemical-mechanical planarization (CMP) processes, such as chemical-mechanical polishing techniques, are typically employed. The use of CMP processes is, however, somewhat undesirable since such processes are known to create defects in the surface of the semiconductor device structure. CMP processes are also known to leave debris, or contaminants, which may be trapped in defects in the surface of the semiconductor device structure and which may subsequently cause electrical shorting of a fabricated semiconductor device. For example, if CMP processes are used to remove mask material and at least part of a conductively doped HSG silicon layer from an insulator at the surface of a stacked capacitor structure, conductive silicon particles may be trapped in defects in the surface of the insulator and subsequently cause electrical shorting between adjacent containers of the stacked capacitor. These potentially damaging contaminants may remain even when a chemical removal process, such as a wet or dry etch, follows the CMP process.

Alternatively, a photoresist may be used as the mask material. Patterning of the photoresist requires several steps in which equipment must be precisely aligned with features, such as the containers of a stacked capacitor structure, fabricated on the semiconductor substrate. Additional handling of the semiconductor device structure is also required when a photoresist is used to mask containers, trenches, or other recesses formed in a semiconductor device structure, which is somewhat undesirable.

Moreover, when conventional blanket deposition techniques are used to fill the recesses of a semiconductor device structure with a material (e.g., to fill the trenches of a shallow trench isolation structure with an electrical insulator material and to fill dual damascene trenches with a conductive material), the material typically forms a nonplanar layer over the semiconductor device structure. Such material layers typically include valleys located over recesses in the underlying semiconductor device structure and peaks located over other regions of the semiconductor device structure. Chemical-mechanical planarization is an example of a conventional technique for removing such materials from the surface of a semiconductor device structure while leaving these materials within the recesses of the semiconductor device structure. As chemical-mechanical planarization processes typically employ an abrasive pad to mechanically planarize structures, however, the peaks of the material layer may break off in larger than desired pieces and subsequently scratch the surface of the semiconductor device structure, forming defects therein.

The art does not teach a semiconductor device structure that includes a nonchemical-mechanical planarized material layer that substantially fills a container, trench, or other recess formed in the semiconductor device structure and which does not substantially cover the remainder of a surface of the semiconductor device structure or which includes only a relatively thin layer of material over the remainder of the surface. The art also fails to teach a method for forming a material layer with these features. In addition, the art lacks teaching of a method for reducing the likelihood that peaks of a nonplanar layer of material will damage a surface of a semiconductor device structure during subsequent planarization of the layer of material.

SUMMARY OF THE INVENTION

The present invention includes semiconductor device structures with substantially planar surfaces. The semiconductor device structures also include containers, trenches, or other recesses that are filled with a material. The material may also cover adjacent surfaces of the semiconductor device structures. If the material covers surfaces of the semiconductor device structures, the thickness of the material covering the surface is less than the depth of the containers, trenches, or other recesses that are substantially filled with material. Preferably, the thicknesses of material covering the surfaces of the semiconductor device structures are less than about half the depth of the containers, trenches, or other recesses. The surfaces of the material or materials that fill the recesses and that may cover the surfaces of the semiconductor device structures have not, however, been chemical-mechanical planarized to achieve the reduced depth of material outside of the recesses.

In one embodiment of the present invention, the semiconductor device structure includes a stacked capacitor structure with a layer of electrically insulative material, or insulator layer, and at least one container recessed or formed in the insulator layer. The insulator layer includes a substantially planar surface, which is referred to herein as the exposed surface of the insulator layer. A layer of electrically conductive material covers the surface of the insulator layer and lines the at least one container. By way of example, the electrically conductive material may be conductively doped hemispherical grain (HSG) silicon. As the stacked capacitor structure would electrically short if the conductive material remained on the surface of the insulator layer between adjacent containers, for the stacked capacitor to function properly, the conductive material must be removed from the surface of the insulator layer prior to completing fabrication of the stacked capacitor but remain within the containers. Thus, this embodiment of the semiconductor device structure includes a substantially planar surface with a nonchemical-mechanical planarized quantity of mask material substantially filling the at least one container. While the mask material may cover regions of the layer of conductive material overlying the surface of the insulator layer, it is preferred that these regions are substantially uncovered by mask material. If mask material does overlie these regions of the layer of conductive material, the thickness of the mask material overlying these regions is less than the depth of the at least one container. Preferably, the thickness of the mask material over these regions of the layer of conductive material is less than about half the depth of the at least one container.

The mask material may be applied to the semiconductor device structure by known processes and is spread across the surface of the stacked capacitor structure so as to substantially fill the at least one container while leaving a thinner, or no, material layer over regions of the layer of conductive material that overlie the surface of the insulator layer. For example, the mask material may be spread across the surface of the stacked capacitor structure by use of spin-on techniques, wherein the mask material is applied at a first speed, the rate of spinning is decreased to a second speed at which the mask material is permitted to at least partially set up, then the rate of spinning is gradually increased, or ramped up, to a third speed at which a desired, reduced thickness of mask material covering the surface may be obtained. The rate at which the stacked capacitor structure is spun may again be decreased to permit the mask material to further set. An edge bead of mask material may then be removed from the stacked capacitor structure and the stacked capacitor structure spun once again to remove solvents from the mask material.

In another embodiment of the semiconductor device structure, a mask is disposed over a shallow trench isolation (STI) structure that includes a semiconductor substrate with a substantially planar surface and shallow trenches recessed, or formed, in the semiconductor substrate. The semiconductor device structure has a substantially planar surface, without requiring chemical-mechanical planarization of the surface of the mask. If material of the mask covers the surface of the semiconductor substrate, the thickness of mask material thereover is significantly less than the depths of the shallow trenches. Preferably, the thickness of mask material covering the surface of the semiconductor substrate is less than about half the depths of the trenches. More preferably, the surface of the semiconductor substrate remains substantially uncovered by the mask material. The present embodiment of the semiconductor substrate may also include conductively doped regions continuous with the surface and located between the trenches formed in the semiconductor substrate.

The shallow trench isolation structure may be formed by known processes. The mask may be formed by applying a quantity of mask material to the shallow trench isolation structure and spreading the mask material over the surface so as to substantially fill each trench thereof. As an example of the manner in which mask material may be spread across the shallow trench isolation structure, the mask material may be spun across the semiconductor substrate at a first speed, the rate of spinning decreased to a second speed to permit the mask material to at least partially set up while remaining in the trenches, then the rate of spinning gradually increased, or ramped up, to a third speed at which a desired, reduced thickness of mask material covering the surface may be obtained. The rate at which the shallow trench isolation structure is spun may again be decreased to permit the mask material to further set. An edge bead of mask material may then be removed from the shallow trench isolation structure and the shallow trench isolation structure spun once again to remove solvents from the mask material. Conductively doped regions of the semiconductor substrate may be formed by exposing the substrate and mask material to a conductivity dopant. The regions of the semiconductor substrate that remain uncovered or that are covered with thinner layers of the mask material (e.g., the surface of the semiconductor substrate) are implanted with the conductivity dopant while regions of the semiconductor substrate that are covered with thicker layers of the mask material (e.g., regions of the semiconductor substrate beneath the trenches) remain substantially undoped.

Another embodiment of a semiconductor device structure according to the present invention includes a surface with one or more recesses formed therein and a layer of a first material substantially filling each recess and at least partially covering the surface. The layer of first material has a nonplanar surface and may include a valley located substantially over each recess in the semiconductor device structure and one or more peaks located substantially over the surface of the semiconductor device structure. A second material disposed over the layer of first material at least partially fills each of the valleys formed in the layer of first material. The second material has a substantially planar surface that is not further planarized following formation thereof.

By way of example, the semiconductor device structure may be a shallow trench isolation structure including a semiconductor substrate with a substantially planar surface and trenches recessed, or formed, in the semiconductor substrate. The trenches are filled with a first, electrically insulative material, which is preferably a low dielectric constant, or "low-k," material, such as a high density plasma (HDP) silicon oxide, or HDP oxide. HDP oxide or another insulative material may be disposed into the trenches by way of known processes, such as chemical vapor deposition (CVD) processes. As the processes that are used to fill the shallow trenches with the first, insulative material are typically blanket deposition processes, the insulative material may also cover the surface of the semiconductor substrate. The surface of a layer of the first, insulative material blanket deposited over a semiconductor substrate with trenches formed therein is nonplanar.

As another example of the deposition of a first material over a semiconductor device structure, each recess of the semiconductor device structure may be a dual damascene type trench substantially filled with a first, conductive material. The first, conductive material may be disposed into each dual damascene trench of the semiconductor device structure by known processes, such as physical vapor deposition (PVD) (e.g., sputtering) or chemical vapor deposition techniques. Since these processes typically form a layer of material that blankets substantially the entire semiconductor device structure, the first, conductive material may also cover the surface of the semiconductor device structure. When blanket deposited over a semiconductor device structure with trenches formed therein, such layers typically have nonplanar surfaces.

The second material is preferably a stress buffer material that facilitates planarization of the layer of insulative material without causing substantial defects in either the insulative material or in the surface of the underlying semiconductor substrate. Exemplary materials that are useful as the stress buffer include resins and polymers that may be applied by way of spin-on techniques. The stress buffer has a substantially planar surface and preferably fills the valleys in the layer of insulative material without substantially covering the peaks thereof.

After the stress buffer material is applied to the semiconductor device structure, it may be spread across the surface of the semiconductor device structure by a spin-on technique that includes spinning the semiconductor device structure at a first speed, decreasing the rate of spinning to a second speed at which the material of the stress buffer within the valleys is permitted to at least partially set, then gradually increasing, or ramping up, the rate of spinning to a third speed at which a desired thickness of stress buffer material covering the surface may be obtained. The rate at which the semiconductor device structure is spun may again be decreased to permit the stress buffer material to further set. An edge bead of stress buffer material may then be removed from the semiconductor device structure and the semiconductor device structure spun once again to remove solvents from the stress buffer material.

If portions of the first material layer protrude through the second material, all or part of the first material layer may be removed with selectivity over the second material by known processes, such as by use of wet or dry etchants. The protruding portions of the first material layer may be partially removed until a surface of the first material is in substantially the same plane as a surface of the second material. The first and second materials may then be substantially concurrently removed from over the surface of the semiconductor device structure by known chemical-mechanical planarization or etching processes. Following the removal of the first and second materials, the surface of the first material remaining in each recess is preferably substantially flush with the surface of the semiconductor device structure. Alternatively, the first material can be selectively removed to expose the surface of the semiconductor device structure, then the second material removed therefrom.

If the semiconductor device structure has a substantially planar surface after the second material is disposed thereon, the first and second materials may be substantially concurrently removed by known chemical-mechanical planarization or etching processes to provide a semiconductor device structure with the first material substantially filling the recesses thereof and having a substantially planar surface.

Other features and advantages of the present invention will become apparent to those of skill in the art through consideration of the ensuing description, the accompanying drawings, and the appended claims.

DETAILED DESCRIPTION OF THE INVENTION

Figure 2:
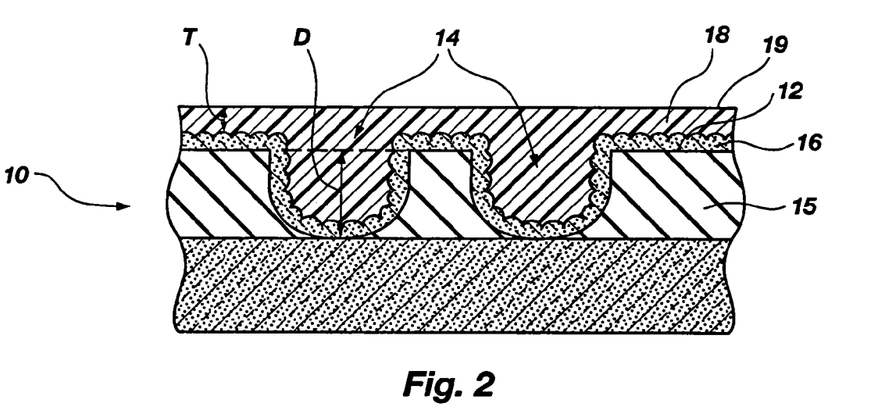
FIG. 2 is a cross-sectional representation of a stacked capacitor structure including a layer of mask material substantially filling the containers thereof and having a substantially planar surface.

With reference to FIG. 2, a semiconductor device structure, in this case a stacked capacitor structure 10, incorporating teachings of the present invention is illustrated. Stacked capacitor structure 10 includes a surface 12 with containers 14 recessed, or formed, in surface 12. As illustrated, surface 12 and containers 14 are lined with a layer 16 of conductively doped hemispherical grain silicon. Stacked capacitor structure 10 also includes a mask layer 18 of a polymer material (e.g., polyimide or photoresist) disposed over layer 16. Mask layer 18 substantially fills containers 14 and has a substantially planar exposed surface 19. The thickness T of portions of mask layer 18 overlying surface 12 is less than the depth D of containers 14 and, preferably, is less than about half of depth D.

Stacked capacitor structure 10, including the conductively doped hemispherical grain silicon layer 16 thereof, may be fabricated by known processes, such as those disclosed in U.S. Pat. No. 5,663,090, issued to Dennison et al. on Sep. 2, 1997, the disclosure of which is hereby incorporated in its entirety by this reference. Mask layer 18 is formed on stacked capacitor structure 10 by dispensing a mask material onto stacked capacitor structure 10 while spinning the substrate bearing stacked capacitor structure 10 relative to an axis perpendicular to a plane of the substrate bearing stacked capacitor structure 10 at a first speed, which is preferably an optimum speed for forming a substantially homogeneous film from the mask material. When a substantially homogeneous film of mask material has been formed on stacked capacitor structure 10, the rate at which stacked capacitor structure 10 is spun is decreased to a second speed. The second speed and the duration at which stacked capacitor structure 10 is spun at the second speed permits the mask material to flow into and to begin to set within containers 14 of stacked capacitor structure 10. The rate of spinning stacked capacitor structure 10 is then gradually increased, or ramped up, to a third speed, which is maintained until a film of mask material covering surface 12 reaches a desired, reduced thickness. The rate at which stacked capacitor structure 10 is spun may again be reduced to further permit the mask material to set. A bead of the mask material formed around the periphery of a substrate (e.g., a wafer) including stacked capacitor structure 10 may be removed by known processes to provide a substantially planar surface over stacked capacitor structure 10. The substrate including stacked capacitor structure 10 may also be spun again to begin removing solvents from the mask material. Mask layer 18 is then subjected to a soft bake, as known in the art, to substantially remove solvents from the mask material.

By way of example, when ARCH 895 photoresist is used as the mask material, the substrate bearing stacked capacitor structure 10 is spun at a first speed of about 1,000 rpm until a substantially homogeneous layer is formed (e.g., about one second to about five seconds). The spinning rate is then decreased to about 100 rpm for a period of about five seconds to about ten seconds to allow the photoresist within containers 14 to begin setting. The rate at which stacked capacitor structure 10 is spun is then gradually increased to a third speed of at least about 1,500 rpm until the photoresist covering surface 12 reaches a desired, reduced thickness or until the photoresist is substantially removed from surface 12. The spin rate is then decreased again, this time to about 50 rpm, for a duration of about 19 to about 50 seconds to permit additional setting, or casting, of the photoresist. Such additional spinning creates a bead of photoresist near an edge of a substrate of which stacked capacitor structure 10 is a part. Known edge bead removal techniques are employed to remove this bead from the edge of the substrate and to provide a substantially planar surface. Any solvent remaining in the photoresist is then substantially removed therefrom by gradually increasing the rate at which stacked capacitor structure 10 is spun to about 5,000 rpm. Mask layer 18 is then subjected to a known soft bake process, preferably at a temperature of about 100° C. to about 150° C. to substantially remove solvents from the photoresist.

Figure 3:
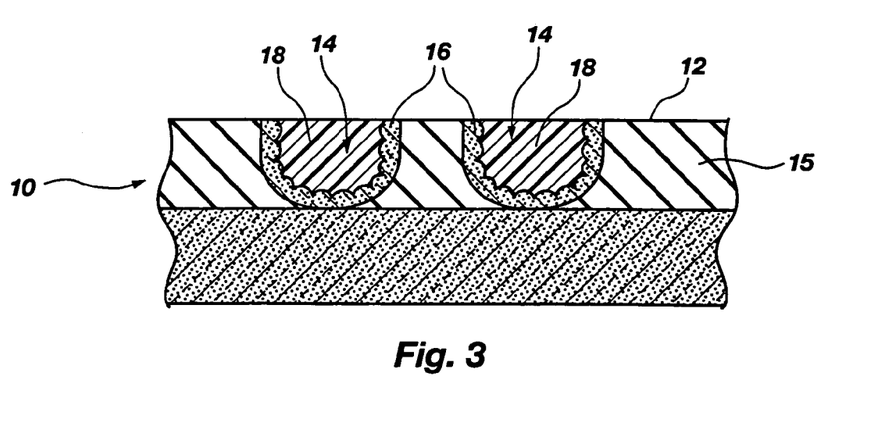
FIG. 3 is a cross-sectional representation of the stacked capacitor structure of FIG. 2, depicting the mask material and conductively doped hemispherical grain polysilicon removed from over the surface, the containers remaining substantially filled with mask material.
Figure 4:
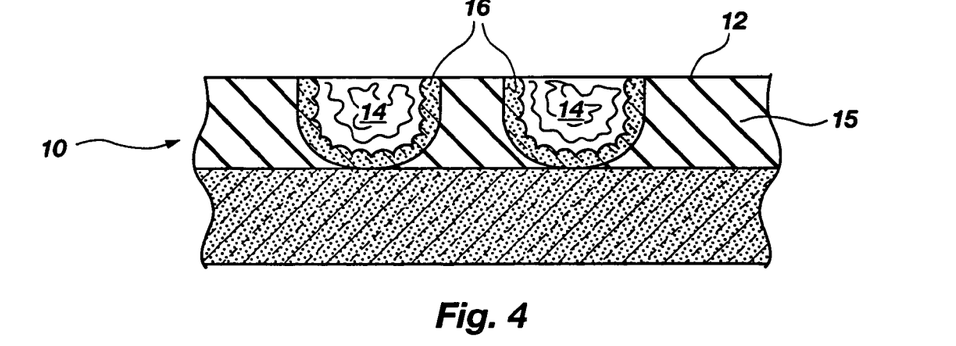
FIG. 4 is a cross-sectional representation of the stacked capacitor structure of FIG. 3 with the mask material removed from the containers.

Referring now to FIG. 3, once a mask layer 18 with a substantially planar surface 19 (see FIG. 2) is formed, the portions of mask layer 18 and of hemispherical grain silicon layer 16 that are located above a plane of surface 12 are removed from stacked capacitor structure 10. In order to reduce or eliminate the creation of potentially contaminating debris and of surface defects that may be caused by mechanical planarization processes, layers 18 and 16 are removed by known chemical processes, such as dry etch processes or wet etch, or wet dip, processes. For example, mask layer 18 may be selectively removed by use of a known resist strip, then layer 16 removed from surface 12 with a wet etchant that removes silicon with selectivity over the portions of mask layer 18 remaining in containers 14 and over an underlying dielectric layer 15. As another example, layers 18 and 16 may be substantially concurrently removed with an etchant or combination of etchants that will remove mask layer 18 and hemispherical grain silicon layer 16 at substantially the same rates. Mask material remaining in containers 14 may then be removed by known processes, such as the use of known wet or dry strip materials (e.g., an ammonium hydroxide (NH$_4$OH) dry strip known in the art as a "piranha" strip when the mask material is ARCH 895 or a similar photoresist). This process provides a stacked capacitor structure 10 with conductively doped hemispherical grain silicon 16-lined containers 14 recessed in a substantially defect- and contaminant-free surface 12 of structure 10 and dielectric layer 15, as shown in FIG. 4. Stacked capacitor structure 10 shown in FIG. 4 may then be processed as known in the art to fabricate a finished stacked capacitor.

Figure 5:
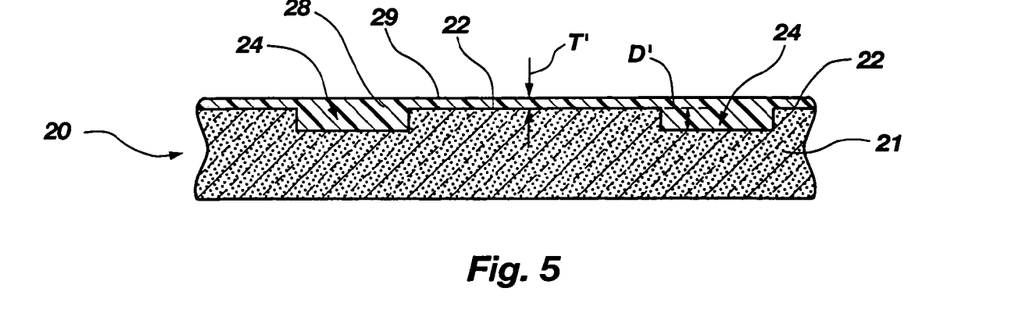
FIG. 5 is a cross-sectional representation of a shallow trench isolation structure including a semiconductor substrate with a surface and trenches formed in the surface and a layer of mask material that substantially fills the trenches and has a substantially planar surface.
Figure 6:
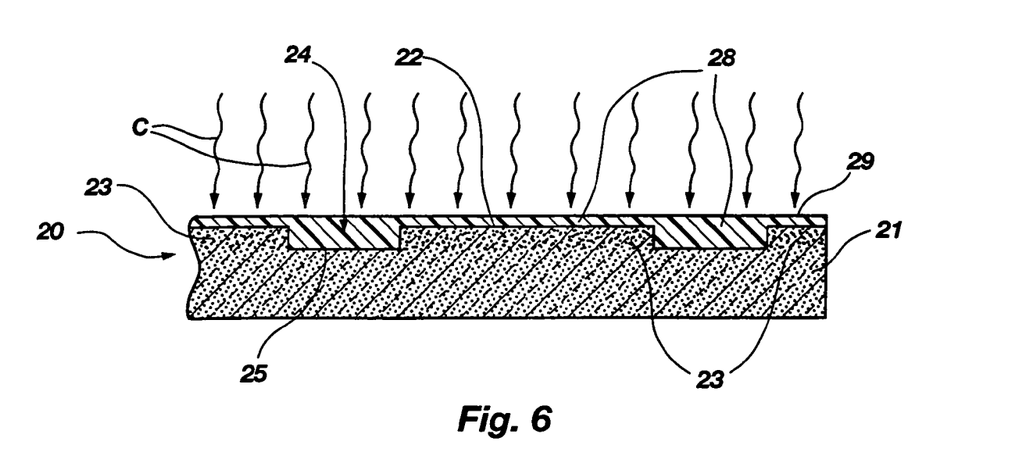
FIG. 6 is a cross-sectional representation of the shallow trench isolation structure of FIG. 5 that schematically illustrates doping of portions of the semiconductor substrate that are continuous with the surface and laterally adjacent the trenches without doping of portions of the semiconductor substrate beneath the trenches.

Turning now to FIGS. 5 and 6, another embodiment of a semiconductor device structure, in this instance a shallow trench isolation structure 20, incorporating teachings of the present invention is illustrated. FIG. 5 depicts a shallow trench isolation structure 20 that includes a semiconductor substrate 21 formed from silicon, gallium arsenide, indium phosphide, or another suitable semiconductor material, and which may be in the form of a wafer or another substrate, such as a silicon-on-glass, silicon-on-sapphire, silicon-on-ceramic, or other silicon-on-insulator type substrate. Semiconductor substrate 21 includes a surface 22 with one or more trenches 24 recessed, or formed, therein. Trenches 24 may be formed in semiconductor substrate 21 by known techniques, such as mask and etch processes. Shallow trench isolation structure 20 also includes a mask layer 28 with a substantially planar surface 29. Mask layer 28 substantially fills trenches 24 and may also cover surface 22 of semiconductor substrate 21. As shown in FIG. 5, the thickness T' of portions of mask layer 28 overlying surface 22 is less than the depth D' of trenches 24. Preferably, thickness T' is less than about half of depth D'. Alternatively, surface 22 may remain substantially uncovered by mask layer 28. Mask layer 28 may be formed from a photoresist or other polymer by processes the same as or similar to those described previously herein with reference to the fabrication of mask layer 18 illustrated in FIG. 2.

FIG. 6 illustrates the implantation of a conductivity dopant C, such as a known p-type or n-type conductivity dopant (e.g., phosphorus (P), boron (B), arsenic (As), or antimony (Sb)), into shallow trench isolation structure 20 through mask layer 28. Conductivity dopant C is prevented from passing through the thicker regions of mask layer 28 into regions 25 of semiconductor substrate 21 located at the bottoms of trenches 24. Conductivity dopant C does, however, pass through thinner areas of mask layer 28 that are located on surface 22 or to exposed areas of surface 22 so as to conductively dope regions 23 of semiconductor substrate 21 continuous with surface 22, which regions lie laterally adjacent trenches 24. Once regions 23 have been conductively doped, mask layer 28 may be removed from trenches 24 and surface 22 (if necessary) to facilitate completion of shallow trench isolation structure 20, as well as the fabrication of semiconductor devices thereon.

Figure 7:
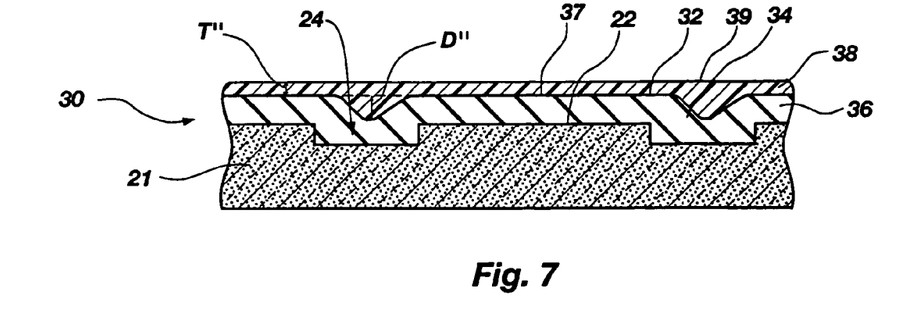
FIG. 7 is a cross-sectional representation of a shallow trench isolation structure including a nonplanar layer of electrically nonconductive material filling the trenches and overlying the surface thereof and a layer of stress buffer material with a substantially planar surface filling recesses in and overlying the layer of electrically nonconductive material.
Figure 8:
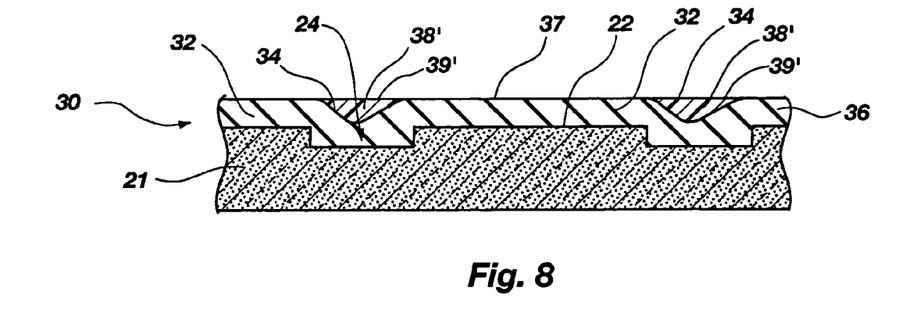
FIG. 8 is a cross-sectional representation of a variation of the shallow trench isolation structure of FIG. 7, which includes stress buffer material with a substantially planar surface partially filling recesses in the layer of electrically nonconductive material.

Referring now to FIGS. 7–11, a second shallow trench isolation structure 30 embodiment of a semiconductor device structure according to the present invention is illustrated. With reference to FIGS. 7 and 8, shallow trench isolation structure 30 includes a semiconductor substrate 21 with a surface 22 and trenches 24 recessed, or formed in, surface 22. A layer of electrically nonconductive material, or insulator layer 36, substantially fills trenches 24 and covers surface 22. Insulator layer 36 has a nonplanar upper surface 37 and includes valleys 34 located substantially above trenches 24 and peaks 32 located substantially above surface 22.

Shallow trench isolation structure 30 may also have a layer 38, 38' of stress buffer material, which is also referred to herein as a stress buffer layer, having a substantially planar surface 39, 39' disposed at least partially over insulator layer 36. FIG. 7 illustrates stress buffer layer 38, which substantially fills valleys 34 recessed in insulator layer 36 and substantially completely covers peaks 32. The thickness T" of regions of stress buffer layer 38 located above peaks 32 is less than the depths D" of valleys 34. Thickness T" is preferably less than about half of depth D". FIG. 8 depicts stress buffer layer 38', which does not extend over peaks 32 and which may only partially fill valleys 34. Stress buffer layers 38, 38' are preferably formed from a photoresist or other polymer by processes the same as or similar to those disclosed previously herein with reference to the fabrication of mask layer 18 illustrated in FIG. 2.

Once a substantially planar surface is formed over shallow trench isolation structure 30, such as that formed at least partially by surface 39 of stress buffer layer 38 and as illustrated in FIG. 7, stress buffer layer 38 and portions of insulator layer 36 located above the plane of surface 22 may be substantially concurrently removed. For example, layers 38 and 36 may be substantially removed by exposure to the same etchant or combination of etchants that will remove stress buffer layer 38 and insulator layer 36 at substantially the same rates to provide the finished shallow trench isolation structure 30 illustrated in FIG. 11. Either wet etchants or dry etchants may be used, Preferably, the use of etchants eliminates the formation of imperfections or defects in surface 22 of semiconductor substrate 21, as well as the possible introduction of contaminants or other debris thereon. Alternatively, known chemical-mechanical planarization processes may be used to substantially concurrently remove stress buffer layer 38 and portions of insulator layer 36 above surface 22, also providing a finished shallow trench isolation structure 30 such as that illustrated in FIG. 11. As stress buffer layer 38 provides a substantially planar surface over shallow trench isolation structure 30, the likelihood that material of insulator layer 36 will be broken off during the chemical-mechanical planarization process is reduced, thereby reducing the formation of imperfections or defects in surface 22, as well as the creation of contaminants or other debris, which may occur during chemical-mechanical planarization of a nonplanar surface.

As shown in FIG. 8, stress buffer layer 38' may not provide shallow trench isolation structure 30 with a substantially planar surface. Rather, peaks 32 of insulator layer 36 protrude above surface 39' of stress buffer layer 38'. In order to provide a substantially planar surface over shallow trench isolation structure 30, the portions of peaks 32 that protrude above the plane of surface 39' may be selectively removed, such as by use of selective wet or dry etch processes. The material of peaks 32 that protrudes above the plane of surface 39' is removed at least until a substantially planar surface 31 is formed over shallow trench isolation structure 30, as depicted in FIG. 9.

Figure 10:
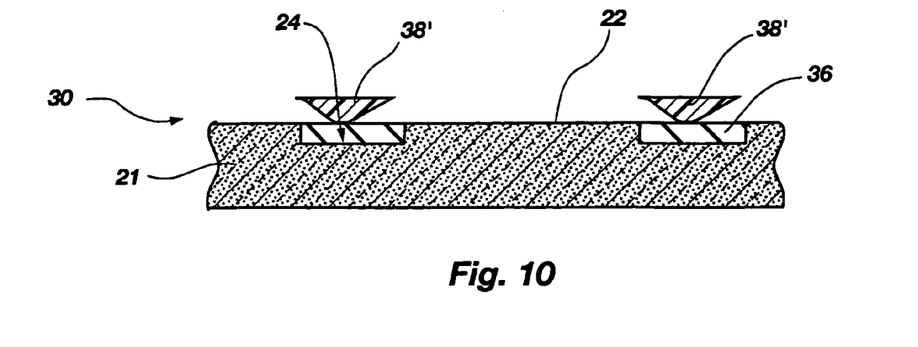
FIG. 10 is a cross-sectional representation of the shallow trench isolation structure of FIG. 9, illustrating stress buffer material disposed at least partially over the electrically nonconductive material remaining in the trenches.

As illustrated in FIG. 10, the selective removal of material forming insulator layer 36 may continue until portions of insulator layer 36 located above the plane of surface 22 are substantially removed. As a result, discontinuous quantities of stress buffer layer 38' remain above trenches 24 and the portions of insulator layer 36 remaining therein. Stress buffer layer 38' may be removed mechanically or by use of a wet or dry etchant that will not substantially remove or react with the materials of semiconductor substrate 21 or of the portions of insulator layer 36 remaining within trenches 24. For example, if a photoresist is used to form stress buffer layer 38', known resist strippers may be used to remove stress buffer layer 38' to form a finished shallow trench isolation structure 30, such as that illustrated in FIG. 11.

Figure 9:
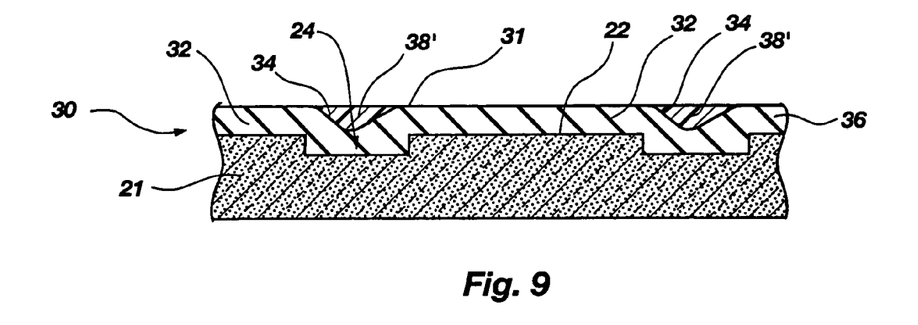
FIG. 9 is a cross-sectional representation of the shallow trench isolation structure of FIG. 8, depicting the layer of electrically nonconductive material partially removed to form a substantially planar surface flush with the surfaces of the stress buffer material in the recesses of the layer.
Figure 11:
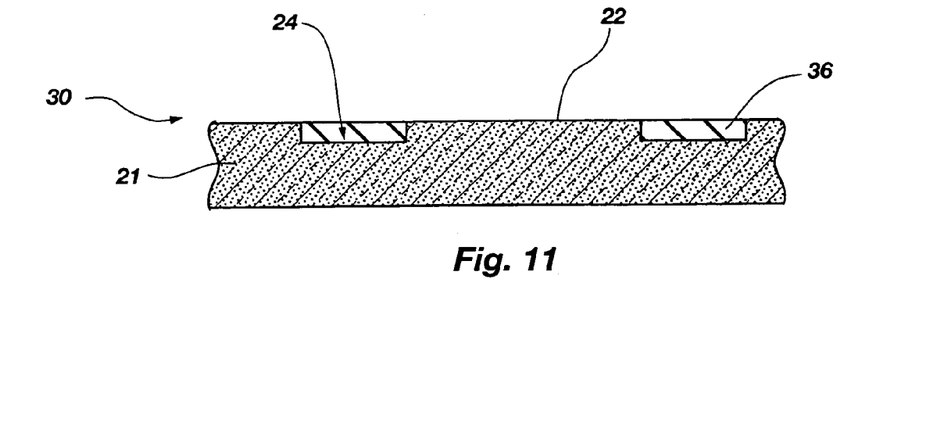
FIG. 11 is a cross-sectional representation of the shallow trench isolation structures of FIGS. 7 and 10, depicting the electrically nonconductive material within the trenches as having a substantially planar surface that is substantially flush with the surfaces of the semiconductor substrates of the shallow trench isolation structures.

Alternatively, once a substantially planar surface 31 has been formed over shallow trench isolation structure 30, as shown in FIG. 9, stress buffer layer 38' and the portions of insulator layer 36 located above the plane of surface 22 may be substantially concurrently removed from above shallow trench isolation structure 30 by use of one or more dry or wet etchants that remove the materials of layers 38' and 36 at substantially the same rates, as known in the art, or by known chemical-mechanical planarization processes to provide the finished shallow trench isolation structure 30 illustrated in FIG. 11.

Once a finished shallow trench isolation structure 30, such as that depicted in FIG. 11, has been fabricated, one or more semiconductor devices may then be fabricated on shallow trench isolation structure 30, as known in the art.

Figure 12:
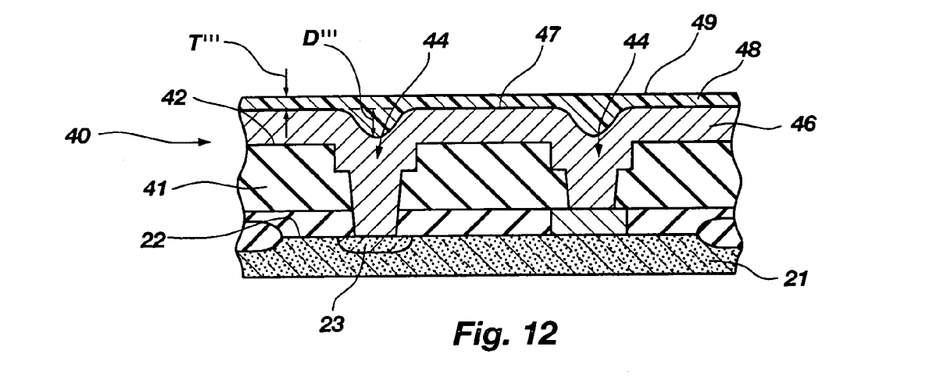
FIG. 12 is a cross-sectional representation of a semiconductor device structure including dual damascene trenches recessed in a surface thereof, a nonplanar layer of conductive material substantially filling the trenches and covering the surface of the semiconductor device structure, and a layer of stress buffer material with a substantially planar surface disposed over and filling recesses in the layer of conductive material.
Figure 13:
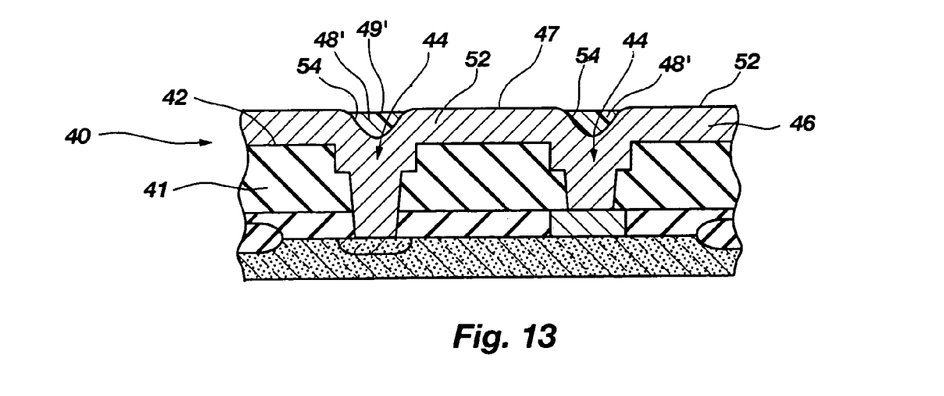
FIG. 13 is a cross-sectional representation of a variation of the semiconductor device structure of FIG. 12, which includes stress buffer material with a substantially planar surface only partially filling recesses formed in the layer of conductive material.

FIGS. 12–16 illustrate yet another embodiment of a semiconductor device structure 40 that incorporates teachings of the present invention. With reference to FIGS. 12 and 13, semiconductor device structure 40 includes dual damascene trenches 44 formed in a surface 42 of an insulator layer 41 thereof. As shown, one or more of trenches 44 may expose a conductively doped region 23 of a semiconductor substrate 21 of semiconductor device structure 40, which conductively doped region 23 is continuous with a surface 22 of semiconductor substrate 21. A conductive layer 46 overlies surface 42 and substantially fills trenches 44. Conductive layer 46 has a nonplanar upper surface 47 that includes valleys 54 located substantially over trenches 44 and peaks 52 located substantially over surface 42. Insulator layer 41, trenches 44, and conductive layer 46, as well as other structures of semiconductor device structure 40 underlying insulator layer 41 and trenches 44 are each fabricated by known processes, such as those disclosed in U.S. Pat. No. 5,980,657 to Farrar et al. issued on Nov. 9, 1999, the disclosure of which is hereby incorporated in its entirety by this reference.

Semiconductor device structure 40 also includes a layer of stress buffer material, which is also referred to herein as a stress buffer layer 48, 48', at least partially covering conductive layer 46 and having a substantially planar surface 49, 49'. FIG. 12 illustrates stress buffer layer 48, which substantially fills valleys 54 recessed in conductive layer 46 and substantially completely covers peaks 52. The thickness T''' of regions of stress buffer layer 48 located above peaks 52 is less than the depths D''' of valleys 54. Thickness T''' is preferably less than about half of depth D'''. FIG. 13 depicts stress buffer layer 48', which does not extend over peaks 52 and which may only partially fill valleys 54. Stress buffer layers 48, 48' are preferably formed from a photoresist or other polymer by processes the same as or similar to those disclosed previously herein with reference to the fabrication of mask layer 18 illustrated in FIG. 2.

Once a substantially planar surface is formed over semiconductor device structure 40, such as that formed at least partially by surface 49 of stress buffer layer 48 and as illustrated in FIG. 12, stress buffer layer 48 and portions of conductive layer 46 located above the plane of surface 42 may be substantially concurrently removed. For example, layers 48 and 46 may be substantially concurrently removed with an etchant or combination of etchants that will remove stress buffer layer 48 and conductive layer 46 at substantially the same rates to provide the finished semiconductor device structure 40 illustrated in FIG. 16. Either wet etchants or dry etchants may be used. Preferably, the use of etchants eliminates the formation of imperfections or defects in surface 42 of insulator layer 41, as well as the possible introduction of contaminants or other debris thereon. Alternatively, known chemical-mechanical planarization processes may be used to substantially concurrently remove stress buffer layer 48 and portions of conductive layer 46 above surface 42, also providing a finished semiconductor device structure 40 such as that illustrated in FIG. 16. As stress buffer layer 48 provides a substantially planar surface over semiconductor device structure 40, the likelihood that material of conductive layer 46 will be broken off during the chemical-mechanical planarization process is reduced, thereby reducing the formation of imperfections or defects in surface 42, as well as the creation of contaminants or other debris, which may occur during chemical-mechanical planarization of a nonplanar surface.

As illustrated in FIG. 13, stress buffer layer 48' may not provide semiconductor device structure 40 with a substantially planar surface. Rather, peaks 52 of conductive layer 46 protrude above surface 49' of stress buffer layer 48'. In order to provide a substantially planar surface over semiconductor device structure 40, the portions of peaks 52 that protrude above the plane of surface 49' may be selectively removed, such as by use of selective wet or dry etch processes. The material of peaks 52 that protrudes above the plane of surface 49' is removed at least until a substantially planar surface 51 is formed over semiconductor device structure 40, as depicted in FIG. 14.

Figure 15:
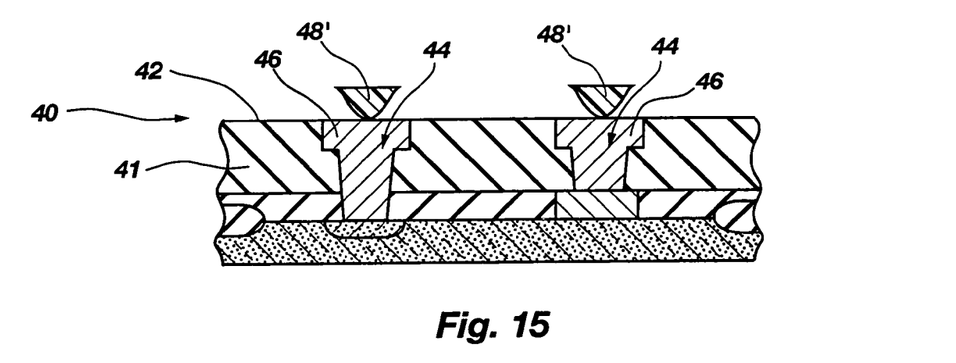
FIG. 15 is a cross-sectional representation of the semiconductor device structure of FIG. 14, illustrating stress buffer material partially disposed at least partially over the conductive material remaining in the trenches.

FIG. 15 illustrates that the selective removal of material forming conductive layer 46 may continue until portions of conductive layer 46 located above the plane of surface 42 are substantially removed therefrom. As a result, discontinuous quantities of stress buffer layer 48' remain above trenches 44 and the portions of conductive layer 46 remaining therein. Stress buffer layer 48' may be removed mechanically or by use of a wet or dry etchant that will not substantially remove or react with the materials of insulator layer 41 or of the portions of conductive layer 46 remaining within trenches 44. For example, if a photoresist is used to form stress buffer layer 48', known resist strippers may be used to remove stress buffer layer 48' to form a semiconductor device structure 40 such as that illustrated in FIG. 16.

Figure 14:
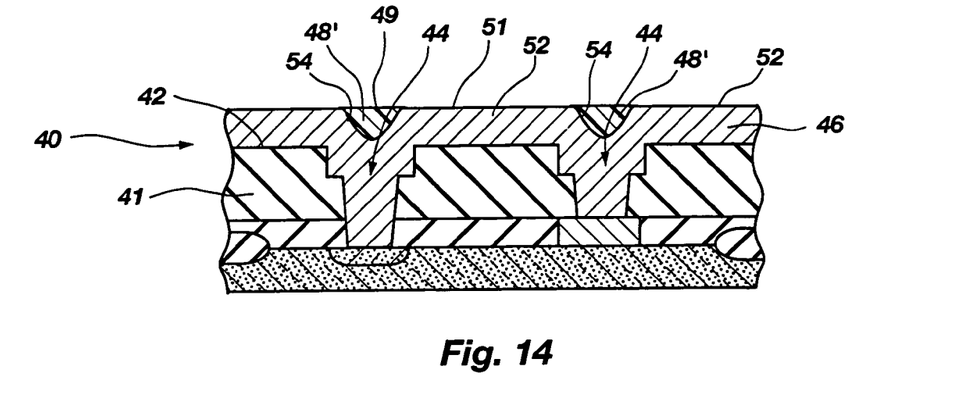
FIG. 14 is a cross-sectional representation of the semiconductor device structure of FIG. 13, depicting the layer of conductive material partially removed to form a substantially planar surface flush with the surfaces of the stress buffer material in the recesses of the layer.
Figure 16:
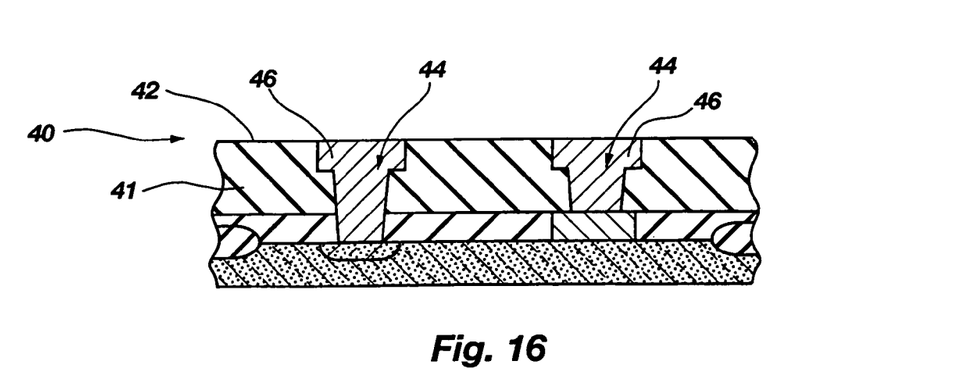
FIG. 16 is a cross-sectional representation of the semiconductor structures of FIGS. 12 and 15, depicting the conductive material within the trenches as having a substantially planar surface that is substantially flush with the surfaces of the semiconductor device structures.

Alternatively, once a substantially planar surface 51 has been formed over semiconductor device structure 40, as shown in FIG. 14, stress buffer layer 48' and the portions of conductive layer 46 located above the plane of surface 42 may be substantially concurrently removed from above semiconductor device structure 40 by use of one or more wet or dry etchants that remove the materials of layers 48' and 46 at substantially the same rates, as known in the art, or by known chemical mechanical planarization processes to provide the semiconductor device structure 40 illustrated in FIG. 16.

Once a semiconductor device structure 40 such as that depicted in FIG. 16 has been fabricated, further known fabrication processes may be performed.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A spin coating method, comprising:
   applying a material to a substrate;
   spinning the substrate and the material at a substantially constant first speed;
   following the spinning, decreasing a rate of spinning to a substantially constant second speed; and
   following spinning at the second speed, increasing a rate of the spinning to a substantially constant third speed that is greater than the first speed.

2. The method of claim 1, wherein spinning the substrate and the material at the first speed comprises substantially filling recesses formed in the substrate with the material.

3. The method of claim 1, wherein decreasing the rate of spinning to the second speed comprises permitting material located within recesses formed in the substrate to set.

4. The method of claim 1, wherein spinning the substrate at the third speed comprises forming a layer comprising the material over a surface of the substrate to a desired thickness.

5. The method of claim 1, further comprising:
   following gradually increasing, again decreasing a rate of spinning of the substrate to a fourth speed.

6. The method of claim 5, comprising permitting the material to set further while spinning the substrate at the fourth speed.

7. The method of claim 5, further comprising:
   following the again decreasing, again increasing a rate of spinning of the substrate to a fifth speed.

8. The method of claim 7, comprising substantially removing solvent from the material while spinning the substrate at the fifth speed.

9. A spin coating method, comprising:
   applying a material to a substrate;
   spinning the substrate and the material at a first speed that permits the material to flow into recesses formed in the substrate;
   spinning the substrate at a second speed that permits the material within the recesses to set, wherein spinning the substrate at the second speed comprises decreasing a rate at which the substrate is spun; and
   following spinning the substrate at the second speed, increasing a rate of spinning of the substrate to a third speed that is greater than the first speed.

10. The method of claim 9, wherein spinning the substrate and the material at the first speed comprises substantially filling the recesses with the material.

11. The method of claim 9, wherein spinning the substrate at the third speed comprises forming a layer comprising the material over a surface of the substrate to a desired thickness.

12. The method of claim 9, further comprising:
    following gradually increasing, again decreasing a rate of spinning of the substrate to a fourth speed.

13. The method of claim 12, comprising permitting the material to set further while spinning the substrate at the fourth speed.

14. The method of claim 12, further comprising:
    following the again decreasing, again increasing a rate of spinning of the substrate to a fifth speed.

15. The method of claim 14, comprising substantially removing solvent from the material while spinning the substrate at the fifth speed.

16. A spin coating method, comprising:
    applying a material to a substrate;
    spinning the substrate at a first speed to at least partially spread the material;
    following spinning the substrate at the first speed, spinning the substrate at a second speed to permit at least some of the material to flow into at least one recess formed in the substrate, wherein spinning the substrate at the second speed comprises spinning the substrate at a speed that is slower than the first speed; and
    following spinning the substrate at the second speed, increasing a rate of spinning of the substrate to a third speed that is greater than the first speed.

17. The method of claim 16, wherein spinning the substrate at the first speed comprises substantially filling the at least one recess with the material.

18. The method of claim 16, wherein spinning the substrate at the third speed comprises forming a layer comprising the material over a surface of the substrate to a desired thickness.

19. The method of claim 16, further comprising:
    following gradually increasing, again decreasing a rate of spinning of the substrate to a fourth speed.

20. The method of claim 19, comprising permitting the material to set further while spinning the substrate at the fourth speed.

21. The method of claim 19, further comprising:
    following again decreasing, again increasing a rate of spinning of the substrate to a fifth speed.

22. The method of claim 21, comprising substantially removing solvent from the material while spinning the substrate at the fifth speed.

* * * * *